United States Patent
Haspeslagh et al.

(10) Patent No.: US 12,276,784 B2
(45) Date of Patent: Apr. 15, 2025

(54) MICROMIRROR ARRAYS

(71) Applicants: ASML Netherlands B.V., Veldhoven (NL); IMEC v.z.w., Leuven (BE)

(72) Inventors: Luc Roger Simonne Haspeslagh, Linden (BE); Veronique Rochus, Leuven (BE); Guilherme Brondani Torri, Leuven (BE); Nitesh Pandey, Eindhoven (NL); Sebastianus Adrianus Goorden, Eindhoven (NL)

(73) Assignees: ASML Netherlands B.V., Veldhoven (NL); IMEC v.Z.W., Leuven (BE)

(*) Notice: Subject to any disclaimer, the term of this patent is extended or adjusted under 35 U.S.C. 154(b) by 456 days.

(21) Appl. No.: 17/635,907

(22) PCT Filed: Aug. 5, 2020

(86) PCT No.: PCT/EP2020/072005
§ 371 (c)(1),
(2) Date: Feb. 16, 2022

(87) PCT Pub. No.: WO2021/032483
PCT Pub. Date: Feb. 25, 2021

(65) Prior Publication Data
US 2022/0283428 A1    Sep. 8, 2022

(30) Foreign Application Priority Data

Aug. 19, 2019 (EP) ..................... 19192311
Sep. 26, 2019 (EP) ..................... 19199718

(51) Int. Cl.
*G02B 26/08* (2006.01)
*G02B 7/18* (2021.01)
*G03F 7/00* (2006.01)

(52) U.S. Cl.
CPC ....... *G02B 26/0858* (2013.01); *G02B 7/1815* (2013.01); *G03F 7/70116* (2013.01); *G03F 7/70891* (2013.01)

(58) Field of Classification Search
CPC .............. G02B 26/0858; G02B 7/1815; G03F 7/70116; G03F 7/70891; G03F 7/70075;
(Continued)

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| DE | 102013225790 A1 | 6/2014 |
| DE | 102017214441 A1 | 5/2018 |

(Continued)

OTHER PUBLICATIONS

International Preliminary Report on Patentability directed to related to International Application No. PCT/EP/2020/072005, mailed Feb. 17, 2022; 8 pages.

(Continued)

*Primary Examiner* — Euncha P Cherry
(74) *Attorney, Agent, or Firm* — Sterne, Kessler, Goldstein & Fox P.L.L.C.

(57) ABSTRACT

A micromirror array comprises a substrate, a plurality of minors for reflecting incident light and, for each mirror (20) of the plurality of minors, at least one piezoelectric actuator (21) for displacing the minor, wherein the at least one piezoelectric actuator is connected to the substrate. The micromirror array further comprises one or more pillars (24) connecting the minor to the at least one piezoelectric actuator. Also disclosed is a method of forming such a micromirror array. The micromirror array may be used in a program- (Continued)

mable illuminator. The programmable illuminator may be used in a lithographic apparatus and/or in an inspection apparatus.

30 Claims, 17 Drawing Sheets

(58) Field of Classification Search
CPC ... G03F 7/70291; G03F 7/7085; H02N 2/028; H10N 30/2042
See application file for complete search history.

(56) References Cited

U.S. PATENT DOCUMENTS

| | | | |
|---|---|---|---|
| 5,523,193 A | 6/1996 | Nelson | |
| 6,696,008 B2 | 2/2004 | Brandinger | |
| 8,294,877 B2 | 10/2012 | Wangler et al. | |
| 8,724,200 B1 | 5/2014 | Wu | |
| 9,791,691 B2 | 10/2017 | Waldis et al. | |
| 9,910,360 B2 | 3/2018 | Deguenther et al. | |
| 9,946,167 B2 | 4/2018 | Smilde et al. | |
| 10,254,654 B2 | 4/2019 | Palmer et al. | |
| 10,474,039 B2 | 11/2019 | Hinnen et al. | |
| 2005/0017334 A1 | 1/2005 | Tao | |
| 2011/0101253 A1 | 5/2011 | Lal et al. | |
| 2014/0211187 A1 | 7/2014 | Hauf et al. | |
| 2016/0069754 A1 | 3/2016 | Gu-Stoppel et al. | |
| 2017/0176870 A1 | 6/2017 | Hinnen et al. | |
| 2017/0363861 A1 | 12/2017 | Hauf et al. | |
| 2018/0073992 A1 | 3/2018 | Van Voorst et al. | |
| 2022/0342199 A1* | 10/2022 | Halbach | G03F 7/7015 |

FOREIGN PATENT DOCUMENTS

| | | |
|---|---|---|
| DE | 102017211864 A1 | 7/2018 |
| EP | 3432048 A1 | 1/2019 |
| EP | 3461787 A1 | 3/2019 |
| JP | 2001-350107 A | 12/2001 |
| JP | 2014-160700 A | 9/2014 |
| JP | 2019-501421 A | 1/2019 |
| TW | 2012-50291 A | 12/2012 |
| WO | WO 98/33096 A1 | 7/1998 |
| WO | WO 98/38597 A2 | 9/1998 |

OTHER PUBLICATIONS

International Search Report and Written Opinion directed to related to International Application No. PCT/EP/2020/072005, mailed Oct. 22, 2020; 12 pages.

* cited by examiner

MICROMIRROR ARRAYS

CROSS-REFERENCE TO RELATED APPLICATIONS

This application claims priority of EP application 19192311.9 which was filed on Aug. 19, 2019 and of EP application 19199718.8 which was filed on Sep. 26, 2019 which are incorporated herein in its entirety by reference.

FIELD

The present invention relates to a micromirror array, a programmable illuminator comprising such a micromirror array, a lithographic apparatus comprising such a programmable illuminator, an inspection apparatus comprising such a programmable illuminator and a method for forming such a micromirror array.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device onto a layer of radiation-sensitive material (resist) provided on a substrate. The term "patterning device" as employed in this text should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device. Examples of such patterning devices include:

A mask (or reticle). The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. The mask may be supported by a support structure such as a mask table or mask clamp. This support structure ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such a device is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis, for example by applying a suitable localized electric field, or by employing electrostatic or piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning means can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. Such a programmable mirror array may be supported by a support structure such as a frame or table, for example, which may be fixed or movable as required; and A programmable LCD array. An example of such a construction is given in U.S. Pat. No. 5,229,872, which is incorporated herein by reference. Such a programmable LCD array may be supported by a support structure such as a frame or table, for example, which may be fixed or movable as required.

For purposes of simplicity, the rest of this text may, at certain locations, specifically direct itself to examples involving a mask and a mask table; however, the general principles discussed in such instances should be seen in the broader context of the patterning means as hereabove set forth.

To project a pattern on a substrate a lithographic apparatus may use electromagnetic radiation (here referred to often as simply "light", though the wavelength may not be in the visible range). The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Besides the wavelength ($\lambda$) of the radiation and the Numerical Aperture (NA) of the projection lens, the shape, or more generally the angular intensity distribution, of the illumination source is one of the most important parameters in enabling high resolution in lithography.

A micromirror array, comprising an array of hundreds or thousands of micromirrors (often referred to below simply as "mirrors"), can be used in the illumination system of a lithographic apparatus to control the cross-sectional shape and intensity distribution of the light. Each micromirror reflects a spot of light and changing the angles of the micromirrors changes the positions of the spots and thus changes the shape of the radiation beam.

Microelectromechanical systems (MEMS) technology may be used to manufacture and control the mirrors. For example, an electrostatic or piezoelectric MEMS system may be used to angle the mirrors.

Currently micromirror arrays exist for shaping light having a wavelength in the deep ultraviolet spectrum (DUV), e.g. $\lambda=193$ nm. However, these micromirror arrays cannot be effectively used at shorter wavelengths as required for light in the extreme ultraviolet spectrum (EUV), e.g. $\lambda=13.5$ nm. New micromirror array technology is required for use with EUV radiation. Also, advantageous new applications for this new micromirror array technology are desired, for use with EUV and/or non-EUV radiation, e.g. visible light or DUV radiation.

SUMMARY

According to a first aspect of the present invention there is provided a micromirror array, which for example may be used in the illumination system of a lithographic apparatus or an inspection apparatus to condition a radiation beam. The micromirror array comprises a substrate and a plurality of mirrors for reflecting incident light. For each mirror, there is at least one piezoelectric actuator for displacing the mirror connected to the substrate, and one or more pillars connecting the or each piezoelectric actuator to the mirror. The pillar(s) may be operative to support the mirror from the piezoelectric actuator(s). Applying a voltage to the piezoelectric actuator can cause the actuator to move the pillar and thereby displace the mirror, in order to change the angle of the mirror and thereby change the shape of the radiation beam. Preferably, the micromirror array includes four piezoelectric actuators for each mirror, arranged so as to enable tip and tilt displacement control of the mirror.

The micromirror array may also comprise, for each mirror in the array, a heat diffuser for diffusing heat from the mirror. In use, the micromirror array will absorb some energy from the incident light, which increases the temperature of the device. This increase in temperature can decrease device performance. Typically, the micromirror array is intended to operate in environment with a gas pressure far less than one atmosphere, in fact typically substantially in a vacuum, so heat convection is substantially zero. Instead, the heat diffuser allows heat to be conducted away, such as to the substrate. Typically, the heat diffuser comprises a flexible element connected between the mirror and the substrate and arranged to flex as the mirror is moved. Note that there is a trade-off between increased flexibility of the heat diffuser, and increased ability for the heat diffuser to conduct heat away from the mirror. Using piezoelectric actuator(s) allows increased force to be applied to the flexible element, in turn allowing the heat diffuser to be selected to provide improved thermal conductivity.

In one example, the heat diffuser may comprise a heat sink and a thermally conductive post connecting the heat sink to the mirror. The heat sink may comprise a flexible membrane, which allows the post to pivot when the mirror is displaced. The flexible membrane can be a patterned silicon layer, which has the advantage of being readily available in a CMOS manufacturing process, without requiring further masks or process steps. The flexible membrane can comprise grooves through the flexible membrane and extending from an outer edge of the heat sink towards the thermally conductive post. The grooves, which may be curved grooves, increase the flexibility of the membrane so as to not impede motion of the mirror. The piezoelectric actuators of preferred embodiments are selected to provide a level of force which is greater than the electrostatic actuators used in some conventional systems, and which is sufficient to deform the flexible member even though it has sufficient cross-sectional area (for example, as measured at the intersection of the flexible member with a circular-cylindrical surface with an axis coinciding with an axis of the post) to permit greater heat diffusion than that provided for conventional mirror arrays. This allows the present micromirror array to be used in applications for which the conventional mirror arrays would be unsuitable.

The heat sink may comprise a layer of metal, such as aluminum, which has a relatively high thermal conductivity compared to e.g. silicon. The thermally conductive post may also be electrically conductive and connected to ground, so as to prevent charge build up on the mirror, which may otherwise impede displacement control of the mirror.

The piezoelectric actuators may comprise a strip of flexible material connected at one end to the substrate, with the pillar being located at the opposite end of the strip of flexible material, and a layer of piezoelectric material provided on the strip of flexible material. The strip and the layer of piezoelectric material may thereby form a cantilever, anchored to the substrate at one (fixed relative to the substrate) end and connected to the mirror via the pillar at the opposite (moving) end. By applying a voltage to the layer of piezoelectric material, the layer can expand or contract and thereby stress the strip and cause it to bend. Each piezoelectric actuator may also comprise a hinge connected to an end of the strip and to the pillar. The hinge has a smaller cross section than the strip in the elongation direction of the strip (i.e. the cross section looking end-on at the strip). For example, the hinge may be formed from the same material as the strip of flexible material (typically silicon), but be patterned to have a smaller cross section to increase its flexibility and thereby cause it to act as a hinge between the strip and the pillar. The reduced cross-sectional area can also decrease the thermal conductivity of the hinge compared to the strip of flexible material, which may therefore be advantageous in preventing heating of the piezoelectric actuator. The pillar may comprise a thermally isolating layer (e.g. oxide) to reduce or prevent heat transfer from the mirror to the piezoelectric actuator. The pillar may also be configured to electrically isolate the mirror from the piezoelectric actuator. This may prevent charge build up on the mirror from affecting the piezoelectric actuator.

The micromirror array may further comprise, for each mirror in the array, a sensing element for sensing displacement of the mirror. The sensing element can allow accurate determination of the mirror position (e.g. tip and tilt angles), which may be important for providing feedback to the piezoelectric actuators. The sensing element may be connected to the piezoelectric actuator. For example, the sensing element may comprise a piezoresistor arranged so that displacement of the mirror causes the piezoresistor to deflect (that is, be deformed). The piezoresistor may have one (fixed) end connected to the substrate and another (moving) end connected to one of the mirror, the pillar, and the piezoelectric actuator. The voltage output from the piezoresistor may be proportional to the displacement of the mirror.

Each mirror in the array is preferably suitable for reflecting light having a wavelength in the range of about 13 nm, such as a narrow range centered substantially on 13.5 nm. This enables the micromirror to be used with a lithographic apparatus operating in the extreme ultraviolet (EUV) spectrum.

According to a second aspect of the present invention there is provided a programmable illuminator that comprises a micromirror array according to the first aspect of the present invention for conditioning a radiation beam.

The programmable illuminator may further comprise a displacement control feedback system configured to determine for each mirror in the micromirror array a position of the mirror and to adjust a voltage applied to the associated piezoelectric actuators based on the determined position and based on a predefined target position of the mirror. The performance of the piezoelectric actuators may change over time, so that the initial calibration of displacement to applied voltage is no longer valid, and the displacement control feedback system can be used to adapt applied voltage based on the measured mirror position. The feedback system may comprise or make use of the sensing element of the micromirror array to determine the mirror position.

According to a third aspect of the present invention there is provided a lithographic apparatus arranged to project a pattern from a patterning device onto a substrate. The lithographic apparatus comprises a programmable illuminator according to the second aspect of the present invention for conditioning a radiation beam used to illuminate the patterning device and/or for conditioning a radiation beam used to measure a target structure on the substrate. The micromirror array in the programmable illuminator may be used in an illumination system of a lithographic apparatus for example to control or condition a cross-sectional shape and/or intensity distribution of the light or radiation beam that is used to illuminate the patterning device. Alternatively or in addition, the micromirror array in the programmable illuminator may be used in an alignment system and/or overlay measurement system, respectively, of the lithographic apparatus to control or condition a spectral and/or spatial distribution of the light or radiation beam that is used to measure a position of an alignment mark(er) or target structure on the substrate and/or to perform an overlay measurement of a mark(er) or target structure on the substrate, respectively.

According to a fourth aspect of the present invention there is provided an inspection apparatus that comprises a programmable illuminator according to the second aspect of the present invention for conditioning a radiation beam used to measure a target structure on a substrate. For example, the micromirror array in the programmable illuminator may be used to control or condition a spectral and/or spatial distribution of the light or radiation beam that is used by the inspection apparatus to measure a target structure, e.g. a mark(er), on the substrate in order to determine the position of that target structure for alignment purposes and/or in order to perform an overlay measurement.

According to a fifth aspect of the present invention there is provided a method of forming a micromirror array. The method may be used to form a micromirror array according to the first aspect of the present invention. The method of forming a micromirror array comprises: providing a substrate, forming a plurality of mirrors for reflecting incident light and for each mirror in the array, forming at least one piezoelectric actuator for displacing the mirror and connected to the substrate. The method further comprises forming one or more pillars for connecting the mirror to the at least one piezoelectric actuator.

The method may comprise forming a heat diffuser for diffusing heat from the mirror by forming a heat sink and a thermally conductive post connected to the mirror, wherein said step of bonding causes the thermally conductive post to connect to the heat sink. The step of forming the heat sink may comprise forming a flexible membrane, which allows the thermally conductive post to pivot when the mirror is displaced. The flexible membrane can be formed by patterning a silicon layer. The step of patterning the silicon layer may comprise forming grooves through the silicon layer that extend from an outer edge of the heat diffuser towards the thermally conductive post. The grooves may be curved grooves.

The step of forming a piezoelectric actuator may comprise forming a strip of flexible material connected at one end to the substrate and a layer of piezoelectric material provided on the strip of flexible material.

The step of forming the pillar may comprise providing a thermally isolating layer in the pillar to reduce or prevent heat transfer from the mirror to the piezoelectric actuator.

The method may further comprise, for each mirror in the array, forming at least one sensing element connected to the at least one piezoelectric actuator for sensing displacement of the mirror. The step of forming the sensing element may comprise forming a piezoresistor arranged so that displacement of the mirror causes the piezoresistor to deflect.

The step of forming at least one piezoelectric actuator for each mirror may include forming four piezoelectric actuators, and said step of forming at least one pillar then includes forming four pillars connected to the mirror, wherein said step of bonding causes each of the four pillars to connect to a respective piezoelectric actuator of the four piezoelectric actuators.

BRIEF DESCRIPTION OF THE DRAWINGS

Embodiments of the invention will now be described, by way of example only, with reference to the accompanying schematic drawings, in which:

FIG. 1b depicts a programmable illuminator for use in the inspection apparatus of FIG. 1a.

DETAILED DESCRIPTION

Figure 1:
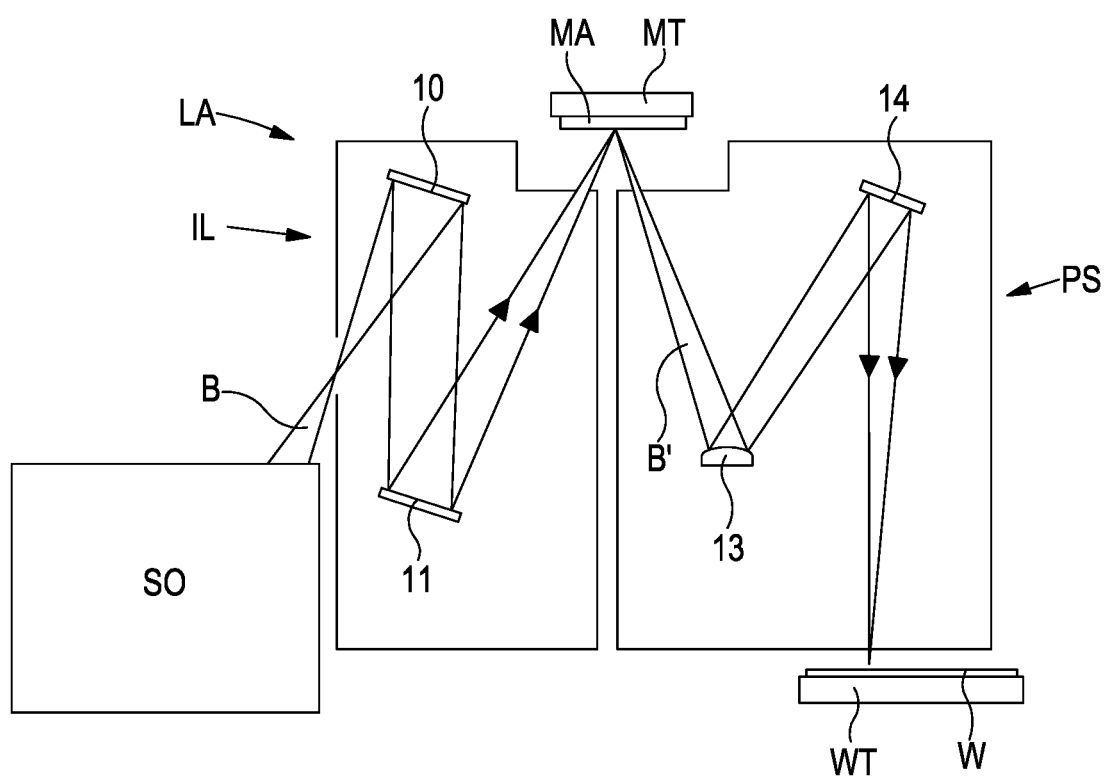
FIG. 1 depicts a lithographic system comprising a lithographic apparatus with a (programmable) illuminator and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure or mask table MT configured to support a patterning device MA, a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The illumination system IL may include other mirrors or devices in addition to, or instead of, the faceted field mirror device 10 and/or the faceted pupil mirror device 11. For example, a micromirror array as described herein may be added to the illumination system IL in addition to the facetted field mirror device 10 and faceted pupil mirror device 11 as disclosed in U.S. Pat. No. 8,294,877 B2, which is hereby incorporated in its entirety by reference, or may be used to replace one or both of the faceted field mirror device 10 and the faceted pupil mirror device 11 as disclosed in U.S. Pat. No. 10,254,654 B2, which is hereby incorporated in its entirety by reference. In that case the illumination system IL, which now includes at least one micromirror array as described herein, is a programmable illuminator IL. Such a programmable illuminator IL may be used for conditioning a radiation beam used to illuminate the patterning device. For example, the programmable illuminator IL may be used to control or condition the EUV radiation beam B by providing it with a desired cross-sectional shape and/or a desired intensity distribution.

After being thus conditioned, the EUV radiation beam B illuminates the patterning device MA and interacts with it. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Figure 1A:
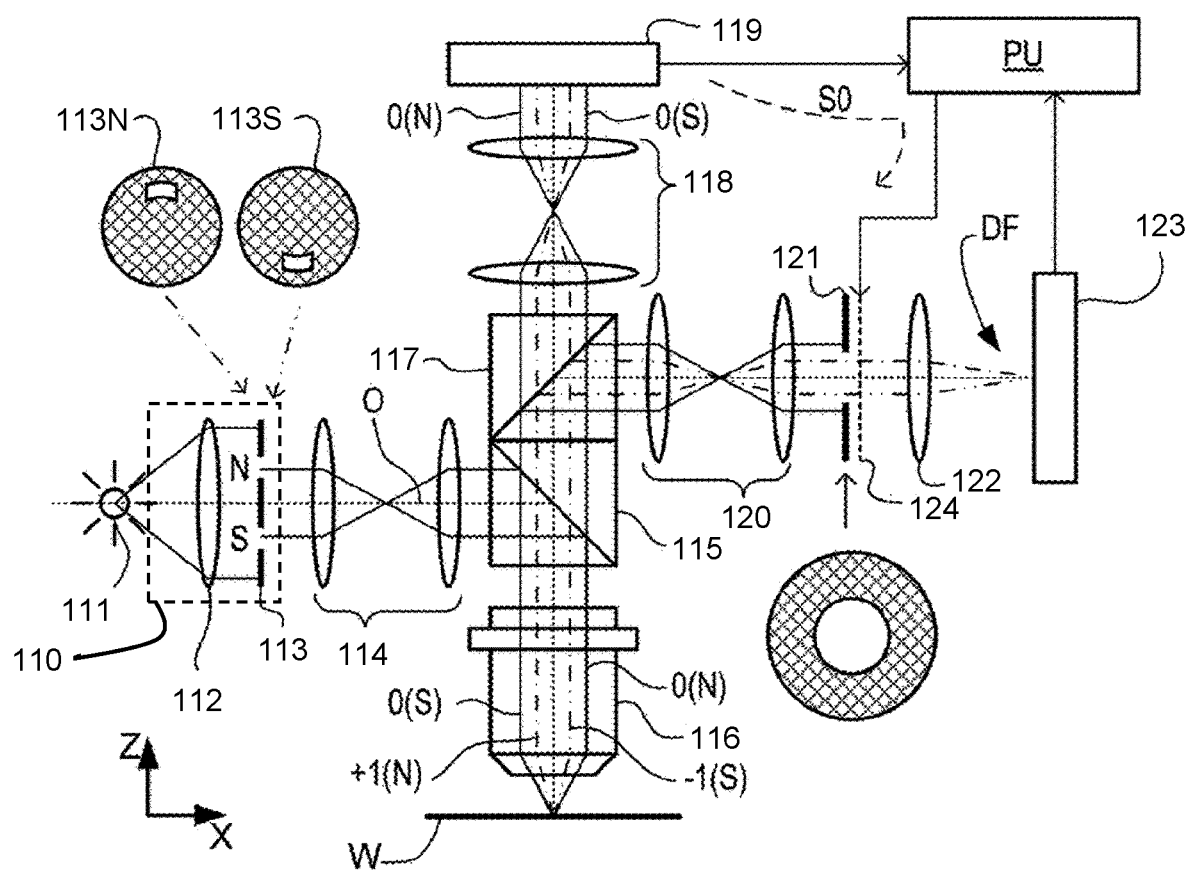
FIG. 1a depicts a known inspection apparatus.

FIG. 1a shows an inspection apparatus that is known from U.S. Pat. No. 9,946,167 B2, which is hereby incorporated in its entirety by reference. FIG. 1a corresponds to FIG. 3a of U.S. Pat. No. 9,946,167 B2. The inspection apparatus is a dark field metrology apparatus for measuring e.g. overlay and/or alignment.

In lithographic processes, it is desirable to frequently make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device and alignment, i.e. the position of alignment marks on the substrate. Various forms of scatterometers have been developed for use in the lithographic field. These devices direct a beam of radiation onto a target structure, e.g. a grating or mark(er), and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The dark field metrology apparatus shown in FIG. 1a may be a stand-alone device/system or may be incorporated in the lithographic apparatus LA as an alignment system and/or as an overlay measurement system (not shown). An optical axis, which has several branches throughout the apparatus, is represented by a dotted line O. In this apparatus, light emitted by radiation source 111 (e.g., a xenon lamp) is directed onto a substrate W via a beam splitter 115 by an optical system comprising lenses 112, 114 and objective lens 116. These lenses are arranged in a double sequence of a 4F arrangement. Therefore, the angular distribution at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 113 of suitable form between lenses 112 and 114, in a plane which is a back-projected image of the objective lens pupil plane. In the example illustrated, aperture plate 113 has different forms, labeled 113N and 113S, allowing different illumination modes to be selected. The illumination system in the present example forms an off-axis illumination mode. In the first illumination mode, aperture plate 113N provides off-axis from a direction designated, for the sake of description only, as 'north'. In a second illumination mode, aperture plate 113S is used to provide similar illumination, but from an opposite direction, labeled 'south'. Other modes of illumination are possible by using different apertures. The rest of the pupil plane is desirably dark, as any unnecessary light outside the desired illumination mode will interfere with the desired measurement signals.

A target structure (not shown), e.g. a grating or mark(er), on substrate W is placed normal to the optical axis O of objective lens 116. A ray of illumination impinging on the target structure from an angle off the axis O gives rise to a zeroth diffraction order ray and two first diffraction order rays. Since the aperture in plate 113 has a finite width (necessary to admit a useful quantity of light) the incident rays will in fact occupy a range of angles, and the diffracted rays 0 and +1/−1 will be spread out somewhat. According to the point spread function of a small target, each order +1 and −1 will be further spread over a range of angles, not a single ideal ray. Note that the grating pitches and illumination angles can be designed or adjusted so that the first order rays entering the objective lens are closely aligned with the central optical axis.

At least the 0 and +1 orders diffracted by the target on substrate W are collected by objective lens 116 and directed back through beam splitter 115. Both the first and second illumination modes are illustrated, by designating diametrically opposite apertures labeled as north (N) and south (S). When the incident ray is from the north side of the optical axis, that is when the first illumination mode is applied using aperture plate 113N, the +1 diffracted rays, which are labeled +1(N), enter the objective lens 116. In contrast, when the second illumination mode is applied using aperture plate 113S the −1 diffracted rays (labeled −1(S) are the ones which enter the lens 116.

A second beam splitter 117 divides the diffracted beams into two measurement branches. In a first measurement branch, optical system 118 forms a diffraction spectrum (pupil plane image) of the target on first sensor 119 (e.g. a CCD or CMOS sensor) using the zeroth and first order diffractive beams. Each diffraction order hits a different point on the sensor, so that image processing can compare and contrast orders. The pupil plane image captured by sensor 119 can be used for focusing the inspection apparatus and/or normalizing intensity measurements of the first order beam. The pupil plane image can also be used for many measurement purposes such as reconstruction.

In the second measurement branch, an optical system including lenses 120, 122 forms an image of the target on the substrate W on sensor 123 (e.g. a CCD or CMOS sensor). In the second measurement branch, an aperture plate referred to as field stop 121 is provided in a plane that is conjugate to the pupil-plane. This plane will be referred to as an 'intermediate pupil plane' when describing the invention. Field stop 121 functions to block the zeroth order diffracted beam so that the image of the target formed on sensor 123 is formed only from the −1 or +1 first order beam. The images captured by sensors 119 and 123 are output to image processor and controller PU, the function of which will depend on the particular type of measurements being performed. Note that the term 'image' is used here in a broad sense. An image of the grating lines as such will not be formed, if only one of the −1 and +1 orders is present.

The illumination system of the inspection apparatus comprises an illuminator 110. As shown in FIG. 1a, this illuminator 110 comprises lens 112 and aperture plate 113. More details of the inspection apparatus can be found in U.S. Pat. No. 9,946,167 B2.

Figure 1B:
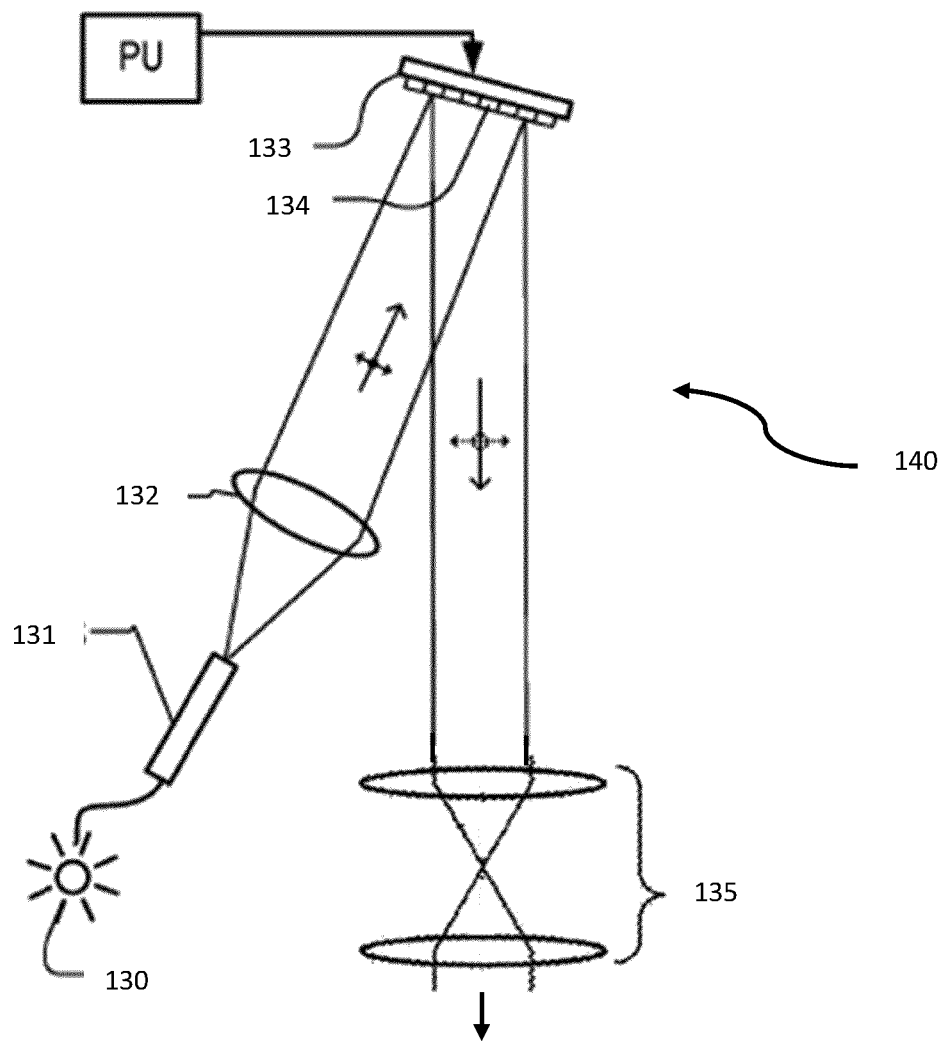

FIG. 1b shows a programmable illuminator 140 for use in the inspection apparatus of FIG. 1a. This programmable illuminator 140 can be used in the inspection apparatus of FIG. 1a instead of the illuminator 110. The programmable illuminator 140 comprises a micromirror array 133 according to the present invention as well as a low NA relay 4F system 135 comprising a pair of lenses. Radiation or light from a radiation source 130 (not part of the programmable illuminator 140), e.g. a broad band radiation source or white light source, may be directed via an optional fiber 131 and an optional collimating lens system 132 to the micromirror array 133. A processing unit PU can control the micromirror array 133 in such a way that the micromirrors 134, or more precise the mirrors in the micromirrors 134, in the micromirror array 133 are tilted individually. By tuning the tilt angle of each individual mirror independently, the spatial distribution of the light that is output by the low NA relay system 135 can be controlled and various illumination modes can be made as desired without having to use aperture plates. If the programmable illuminator 140 is used in the inspection apparatus of FIG. 1a it interfaces with lenses 114, meaning that the light that is output by the low NA relay system 135 is received by the lenses 114 of FIG. 1a.

In order to control the spectral distribution of the light that is output by the low NA relay system 135 at least part of the mirrors may comprise a grating on top of the mirror surfaces (not shown). The grating may be the same for all mirrors or, alternatively, different gratings, e.g. gratings having different pitches, may be used. By appropriate control of the micromirror array 133 the light that is output by the low NA relay system 135 comprises a single wavelength or a single (narrow) range of wavelengths. It is however also possible to control the micromirror array 133 in such a way that the light that is output by the low NA relay system 135 comprises a number of different wavelengths or a number of different (narrow) ranges of wavelengths. The gratings may be lithographically patterned on the mirror surfaces. Each mirror with grating diffracts light of different wavelengths in different directions according to the associated grating equation. A portion of the diffracted light is captured by the low NA relay system 135 and an image is formed. By tuning the angle of each mirror independently, the light distribution at the output can be controlled both spatially and spectrally as (a) certain diffraction order(s) will be captured by the low NA relay system 135 and (an)other diffraction order(s) will not be captured. Such a spatial and spectral light distribution can be used advantageously for example for illuminating and measuring an overlay target structure on a substrate or for measuring the position of an alignment mark on a substrate. In this text, the terms target structure, target, mark, marker and grating are, where the context allows, all synonyms of each other.

The spectral bandwidth of the diffracting beam which can be captured by the low NA relay system 135 is $d\lambda = P.NA$ where P is the pitch of the grating and NA is the numerical aperture of the low NA relay system 135. With P=500 nm and NA=0.02 the spectral bandwidth is 10 nm, meaning that a diffraction order of the grating comprises a range or band of wavelengths of 10 nm.

The spatial resolution of the low NA relay system 135 is $\sim \lambda/NA$. With $\lambda$=850 nm and NA=0.02 the spatial resolution is 42.5 micrometer. If the size of the mirrors Is greater than 42.5 micrometer, each mirror can be resolved. A reasonable size of a mirror is 100×100 micrometer.

By rotating/tilting the mirrors around their individual axis, a different central wavelength band can be directed into the low NA relay system 135. The rotating range of each mirror required for operation over the visible wavelength range should be $\Delta\lambda/2P$, where $\Delta\lambda$=400 nm for an operating wavelength range of 450 nm-850 nm. This means that each mirror must be able to rotate by 0.4 radians.

Figure 2:
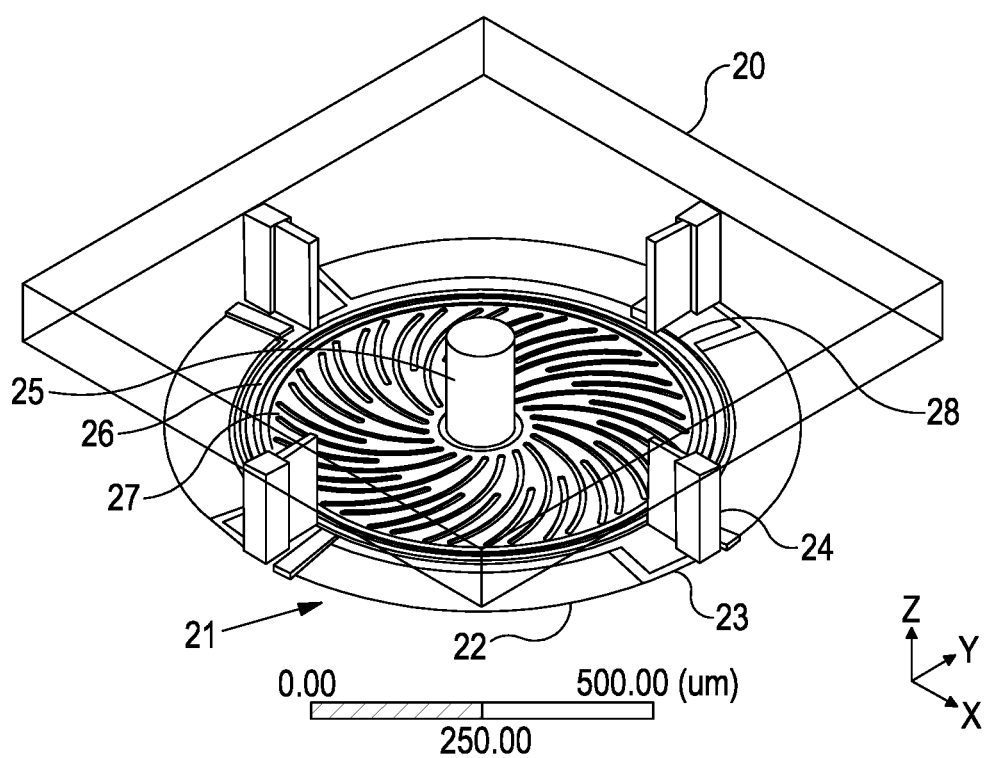
FIG. 2 depicts a part of a micromirror array comprising a mirror and four piezoelectric actuators.

The MEMS system shown in FIG. 2 is a micromirror with a mirror 20 and four piezoelectric actuators 21 for displacing the mirror 20. In other embodiments (not shown) the micromirror may have a different number of piezoelectric actuators 21 for displacing the mirror 20. In all these embodiments the micromirror has at least one piezoelectric actuator 21 for displacing the mirror 20. A number of micromirrors as shown in FIG. 2 can be arranged in an array to form a micromirror array.

FIG. 2 shows a MEMS system with a mirror 20 which may be a part of a micromirror array according to an embodiment. The MEMS system has a four-fold rotational symmetry about an axis. In particular, four piezoelectric actuators 21 are arranged symmetrically under the mirror 20 to enable tip and tilt displacement of the mirror 20. The mirror 20 is typically rectangular (which in this document is used to include square) with each side being in the range 0.5 mm to 2.5 mm. For example, it may be square with a 1 mm² surface area. In other embodiments the mirror may be another shape, such as hexagonal. Each piezoelectric actuator 21 has a curved strip of flexible material 22, fixed to the underlying substrate (no shown) at one end and connected via a hinge 23 to a pillar 24. The strip of flexible material 22 has an elongation direction which at rest lies substantially parallel to the plane of the front surface of the mirror 20. The strip of flexible material 22 has a layer of piezoelectric material (e.g. PZT) on it, to which a voltage can be applied in order to activate the piezoelectric actuator 21. When activating the piezoelectric actuator 21, the strip 22 bends, acting as a cantilever, to displace the mirror 20 via the pillar 24. The magnitude of the displacement is a function of the applied voltage (as well as being a function of other parameters, such as the geometry of the piezoelectric actuator). The hinge 23 is formed by narrowing the strip 22 at one end, so that the cross sectional area of the hinge 23 is smaller than that of the strip 22 along the elongation direction of the strip 22. The hinge 23 is therefore less stiff than the strip 22, which allows it to act as a hinge. The hinge is typically required to flex in a plane transverse to an axis direction, which itself is transverse to the elongation direction of the strip 22.

The mirror 20 is also connected to a heat diffuser, comprising a thermally conductive post 25 connected to the center of the back of the mirror 20, and a heat sink 26 connected to the other end of the post 25. In a rest condition, the length direction of the post 25 is the axis of four-fold rotational symmetry of the MEMS system. The thermally conductive post 25 is arranged to transfer heat from the mirror 20 to the heat sink 26, which diffuses the heat over a relatively large surface area. The heat sink 26 comprises a flexible membrane being a circular, patterned silicon layer. It may alternatively have multiple layers; if so, one or more (e.g. all) of the layers may be silicon, and one or more layers may be of material of other than silicon. The flexible membrane has curved grooves 27 formed in it, which increase the flexibility of the flexible membrane. In use, when the mirror 20 is displaced, the thermally conductive post 25 pivots and elastically deforms the flexible membrane.

Each piezoelectric actuator 21 is associated with a sensing element 28, being a piezoresistor fixed to the pillar 24 at one end and to the underlying substrate at the other. As the pillar 24 is displaced, the piezoresistor is stressed/deformed, which changes the electric properties of the piezoresistor, from which the displacement can be determined. For example, the piezoresistor may be connected in a Wheatstone bridge, configured so that the output voltage of the bridge is a function of the displacement of the mirror 20. The output from the piezoresistor is temperature sensitive, and temperature compensation may be used to increase the accuracy of displacement measurements.

Figure 3:
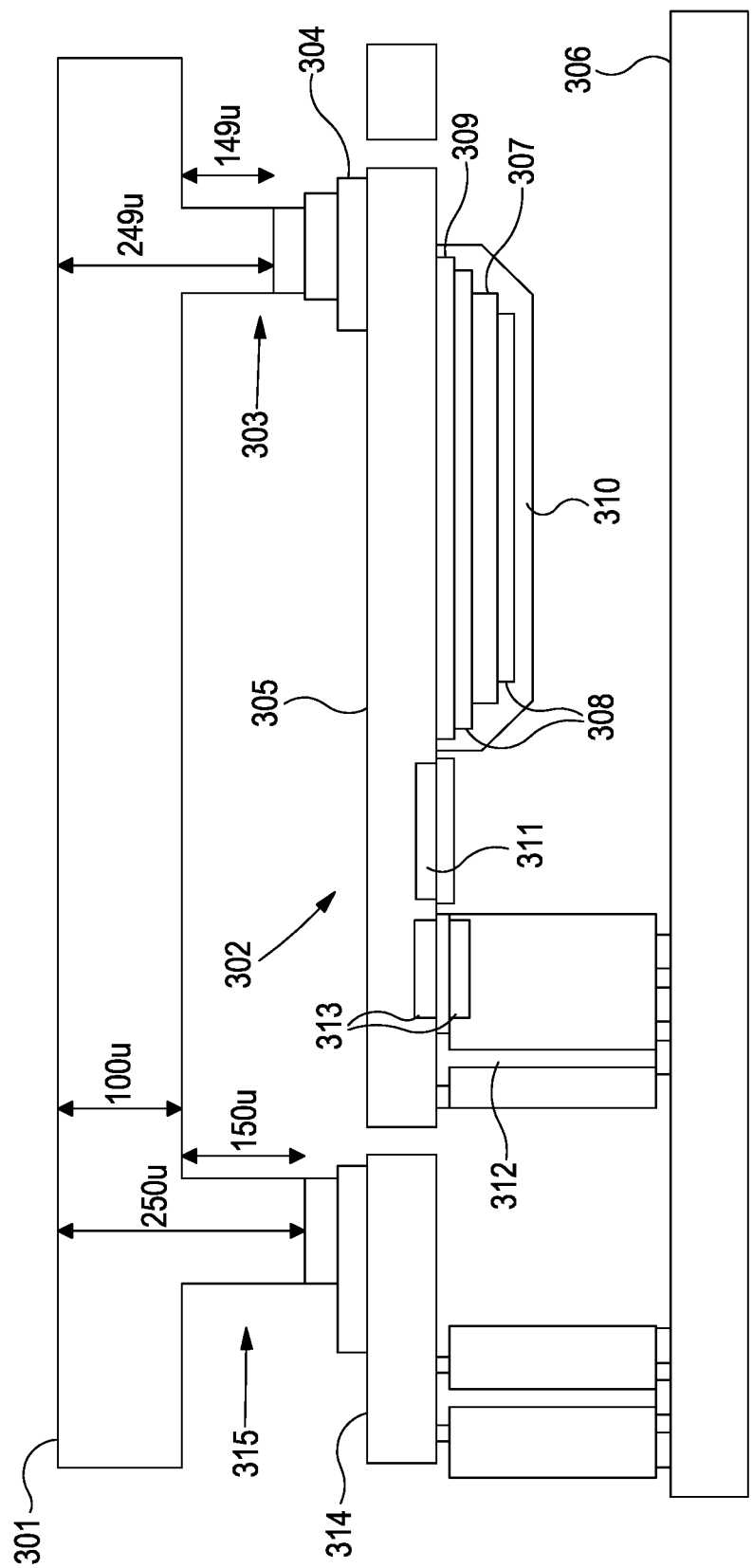
FIG. 3 depicts a schematic cross section of a part of a micromirror array according to an embodiment.

FIG. 3 shows a schematic diagram of a cross section of a part of a micromirror array 300 according to an embodiment. A mirror 301 is connected to a piezoelectric actuator 302 via a pillar 303. The pillar 303 comprises layers of silicon, germanium, aluminum and oxide having a combined thickness of 151 μm. The oxide layer 304 has a thickness of 1 μm and provides both thermal and electrical insulation to protect the piezoelectric actuator 302.

The piezoelectric actuator 302 comprises a strip of flexible material 305, being a 5 μm thick strip of silicon, connected to a substrate 306 at the opposite end from the pillar 303. The piezoelectric actuator 302 also comprises a layer of piezoelectric material 307 being a layer of PZT having a thickness in the range of 500 nm to 2 μm. The layer of piezoelectric material 307 has top and bottom electrodes 308 made of platinum (Pt) and LaNiO3 (LNO) for applying a voltage to the layer of piezoelectric material 307. The layer of piezoelectric material is bonded to the strip of flexible material 305 by a layer of nitride (SiN) 309 having a thickness of 100 nm. The stack of SiN/Pt/LNO/PZT/Pt/LNO is covered by a layer of silicon oxide and aluminum oxide 310. Applying a voltage to the electrodes 308 causes the layer of piezoelectric material 307 to contract or expand, but because the layer is constrained at the interface to the strip of flexible material 305, the combined system of the layer of piezoelectric material 307 and the strip of flexible material 305 bends. It is this bending motion of the piezoelectric actuator 302 which displaces the pillar 303 and thereby also the mirror 301.

A sensing element 311 comprising a piezoresistor is embedded in the strip of flexible material 305 and covered by oxide. The sensing element 311 is arranged to sense the deflection of the piezoelectric actuator 302.

The piezoelectric actuator 302 is electrically connected to the substrate 306 by a through silicon via (TSV) 312. Application specific integrated circuits (ASICs) 313 can be used to apply the voltage to the piezoelectric actuator 302 and also to derive the output voltage from the sensing element 310.

The mirror 301 is connected to a heat sink 314 by a thermally conductive post 315. The heat sink 314 and the thermally conductive post 315 together form a heat diffuser for dissipating heat from the mirror 301. The post 315 comprises layers of silicon, germanium and aluminum. The heat sink 314 comprises a flexible element, specifically in this example a flexible membrane of silicon, which allows the post 315 to move as the mirror 301 is displaced. The heat sink 314 is electrically connected to the substrate 306, and may be grounded to prevent charge build up on the mirror 301. The heat sink 314 and the strip of flexible material 305 are in the same plane and may be formed from the same silicon wafer. The spacing between the lower surface of the mirror 301 and the upper surface of the heat sink 314 and/or the strip of flexible material 305 may be in the range 50 μm-120 μm, such as about 80 μm. Typically, known micromirror arrays have a smaller spacing than this, such as only a few microns. The greater spacing is achieved in this embodiment because the (piezoelectric) actuation force is generated on the strip of flexible material 305, rather than, for example, by an electrostatic actuator mounted on the mirror itself, which would typically limit the range of movement of the mirror to the the range of relative movement of components of the electrostatic actuator.

The spacing between the lower surface of the heat sink 314 and/or the strip of flexible material 305, and the upper surface of the substrate may be in the range 50 μm-120 μm, such as about 80 μm.

Each mirror may be provided with one or more control units which are operative to recognize, in a received control signal, an address corresponding to the mirror, and, upon recognizing the address, to generate control voltages for one or more piezoelectric actuators of the mirror based on control information additionally contained in the control signal. The control units may be implemented as the ASICs 313 which receive the control signals using the vias 312 and control the corresponding piezoelectric actuator 302 based on it; in this case, the address in the control signal may specify not only the mirror but also the ASIC 313 for a given piezoelectric actuator 302. Using the control units, an external control system is able to individually control all the mirrors of the mirror array, by transmitting identical control signals to the control units of all of the mirrors, such that each control unit recognizes control signals addressed to it, and controls the corresponding piezoelectric actuator(s) accordingly. Positioning the ASICs 313 within the structure, e.g. supported above the substrate 306 and proximate to (e.g. substantially in plane with) the strip of flexible material 305, is achievable because the embodiment may be formed in multiple layers by a MEMS process, as described below.

Figure 4:
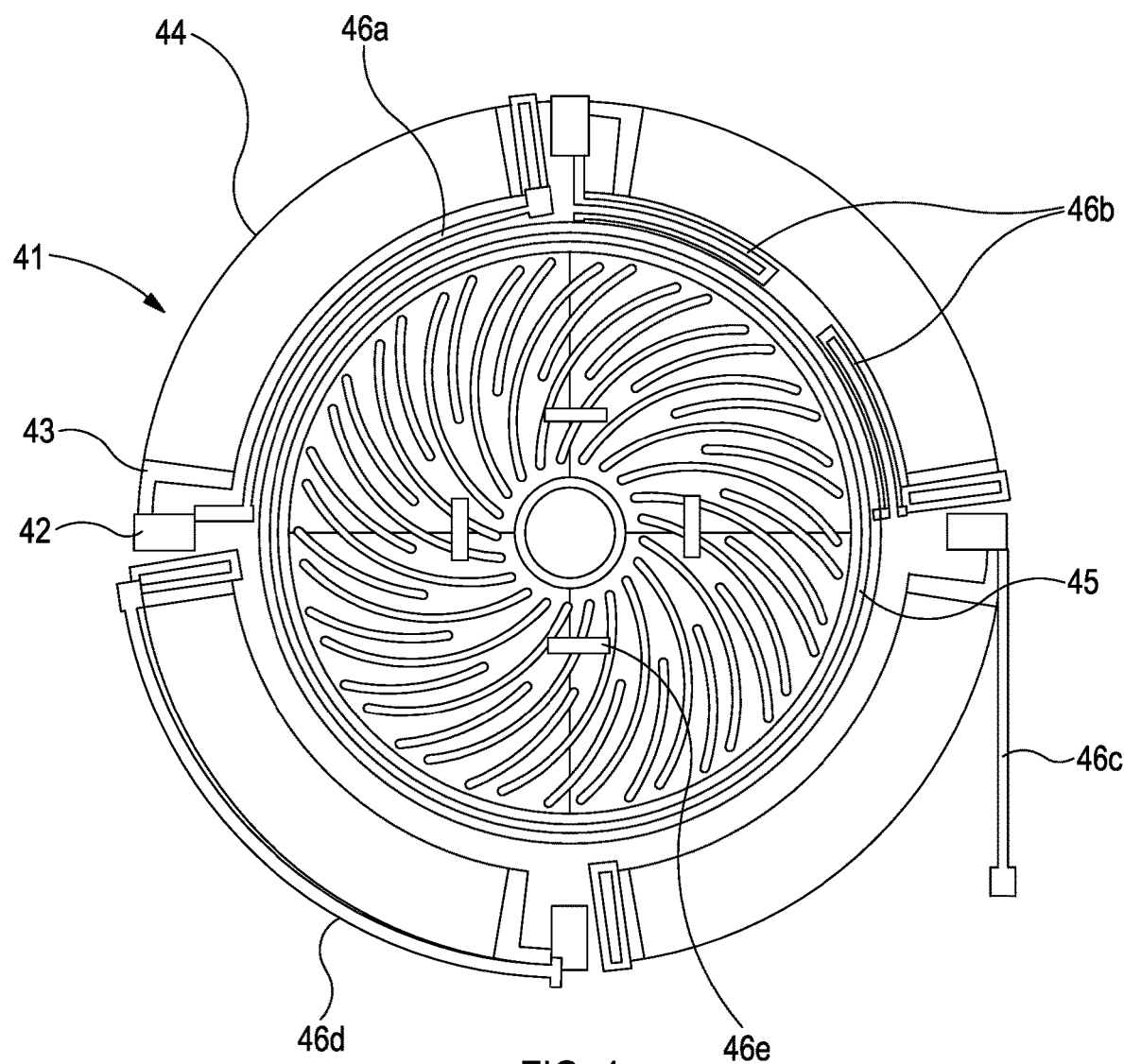
FIG. 4 depicts a part of a micromirror array according to another embodiment having multiple different sensing elements for sensing mirror displacement.

FIG. 4 shows a schematic diagram of a top view of a MEMS system 40 for controlling a mirror (not shown) in a micromirror array according to an embodiment. The system 40 comprises four piezoelectric actuators 41 connected to the mirror by respective pillars 42. Each piezoelectric actuator 41 comprises a strip of flexible material 43 and a hinge 44, wherein the pillar 42 is connected to the hinge 44 at one end of the strip 43 and wherein the other end of the strip 43 is connected to (that is, in a substantially fixed positional relationship to) the substrate (not shown). The system 40 also comprises a heat diffuser 45 for diffusing heat from the mirror when in use. The heat diffuser 45 comprises a circular silicon layer fixed to the substrate along an outer edge of the silicon layer and a thermally conductive post connected to the center of the silicon layer.

The system 40 comprises any one or more of five different types of sensing elements 46a to 46e illustrated in FIG. 4 for sensing a displacement of the mirror. Each sensing element 46a to 46e comprises a piezoresistor arranged so that displacement of the mirror induces stress in the piezoresistor. Preferably, each of the actuators is provided with only one of these five types of sensing element 46a to 46e, and the same type of sensing element is used in each of the four actuators.

A first type of sensing element 46a comprises a curved beam located in the annular space between the heat diffuser 45 and the piezoelectric actuator 41 and fixed to the substrate at one end and to the pillar 42 at the opposite end. One or more piezoresistors may be formed in the beam.

A second type of sensing element 46b comprises two folded beams comprising respective piezoresistors, each located in the annular space between the heat diffuser 45 and the piezoelectric actuator 41. One of the folded beams is connected to the substrate and to the pillar 42, whereas the other folded beam is connected to two different points of the substrate to provide a reference value.

A third type of sensing element 46c comprises a straight beam comprising a piezoresistor connected to the pillar 42 at one end and to the substrate at the other end.

A fourth type of sensing element 46d comprises a curved beam comprising a piezoresistor, the beam being located outside the piezoelectric actuator 41. The beam is connected to the substrate at one end and to the pillar 42 at the opposite end.

A fifth type of sensing element 46e comprises four piezoresistors fixed to the heat diffuser 45. The fifth sensing element 46e is for sensing deformation of the heat diffuser caused by displacement of the mirror.

Figure 5:
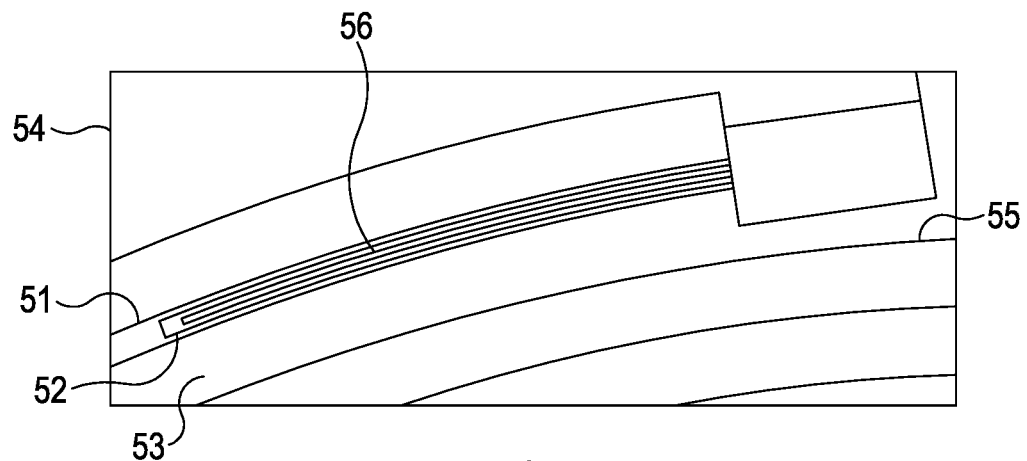
FIG. 5 depicts a part of a sensing element having a piezoresistor.

FIG. 5 shows a schematic diagram of a top view of a part of a sensing element 50, which may be the first sensing element 46a in FIG. 4 but the other sensing elements have a similar construction. The sensing element 50 comprises a curved beam 51 and a folded piezoresistor 52 in the annular space 53 between the piezoelectric actuator 54 and the heat diffuser 55. A temperature sensor 56 may be provided to measure the temperature of the piezoresistor 52. The temperature sensor may for example be implemented as a bipolar transistor or a diode, since for such devices the current is a function of temperature.

Figure 6:
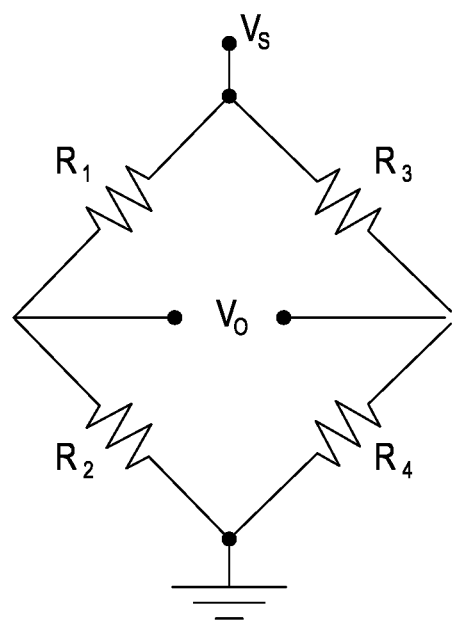
FIG. 6 depicts a circuit diagram of a Wheatstone bridge.

FIG. 6 shows a circuit diagram of a Wheatstone bridge having a supply voltage $V_s$, resistors R1, R2, R3 and R4, and output voltage $V_o$. The circuit may be a part of the sensing element for sensing displacement of the mirror in a micromirror array. One or more of the resistors R1 to R4 may be piezoresistors of the sensing element.

Figure 7A:
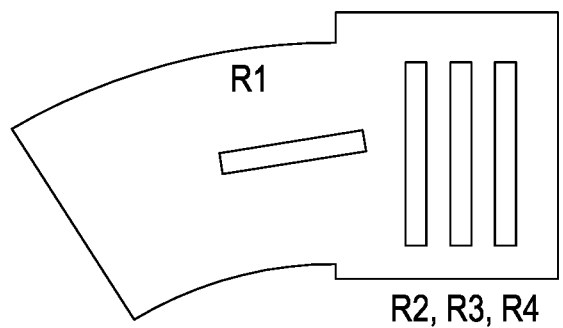
FIG. 7a depicts a configuration of resistors in a sensing element.

FIG. 7a shows a schematic diagram of a particular configuration of resistors R1 to R4 of the Wheatstone bridge in a sensing element 70 comprising a curved beam 71. R1 is a piezoresistor extending along the elongation direction of the beam 71 towards the moving end of the beam. R2 to R4 are located at the end of the sensing element 70 that is fixed to the substrate. As the beam 71 is deflected/stressed due to displacement of the mirror, the resistance of R1 changes while the resistances of R2 to R4 remain substantially constant.

Figure 7B:
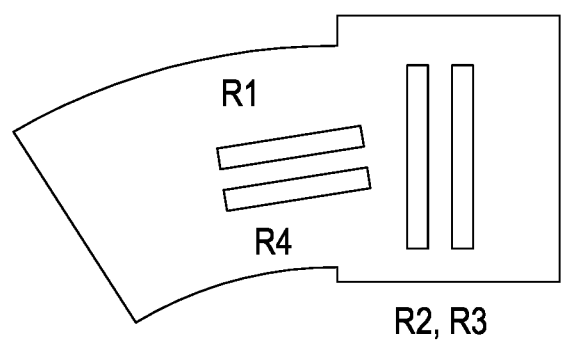
FIG. 7b depicts another configuration of resistors in a sensing element.

FIG. 7b shows a schematic diagram of an alternative configuration of the resistors R1 to R4 of the Wheatstone bridge in a sensing element 70 comprising a curved beam 71. In this configuration, two piezoresistors (R1 and R4) extend along the elongation direction of the beam 71, while R2 and R3 are located at the end of the sensing element that is fixed to the substrate. As the beam 71 is deflected/stresses due to displacement of the mirror, the resistance of R1 and R4 changes while the resistances of R2 and R3 remain substantially constant.

As mentioned above, one or more of the piezoresistors R1 to R4 may be provided with a temperature sensor. In this case, the temperature value output by the temperature sensor(s) may be employed (using circuitry which is not shown) to modify the operation of the sensing element to correct for temperature variations in the piezoresistors, i.e. to correct for temperature variations in the relationship between resistance and deflection/stress in the resistors R1 to R4.

Embodiments of the micromirror array can provide tip and tilt displacement range of +/− 120 mrad and a mirror accuracy of 100 µrad. Embodiments of the micromirror array can be operated at high light intensities as required for EUV, and may work at 40 to 60 kW/m² of absorbed thermal power density (which implies an incident light power density on the surface of the mirror which is even larger). This is orders of magnitude higher than the absorbed thermal power density of micromirror arrays used in some other applications. This is possible because the piezoelectric actuators 41 are operative to provide, even at a relatively low actuator voltage (e.g. under about 100V), such a strong force that they are able to deform the flexible element (flexible member 314) even though the flexible element is thick enough to provide high heat conductivity to the substrate. Due to the high thermal conductivity, the micromirror array may in use have a temperature of under about 100 degrees Celsius.

Methods of forming a micromirror array are also described herein. FIGS. 8a to 8j illustrate some of the steps of an embodiment of such a method.

Figure 8A:
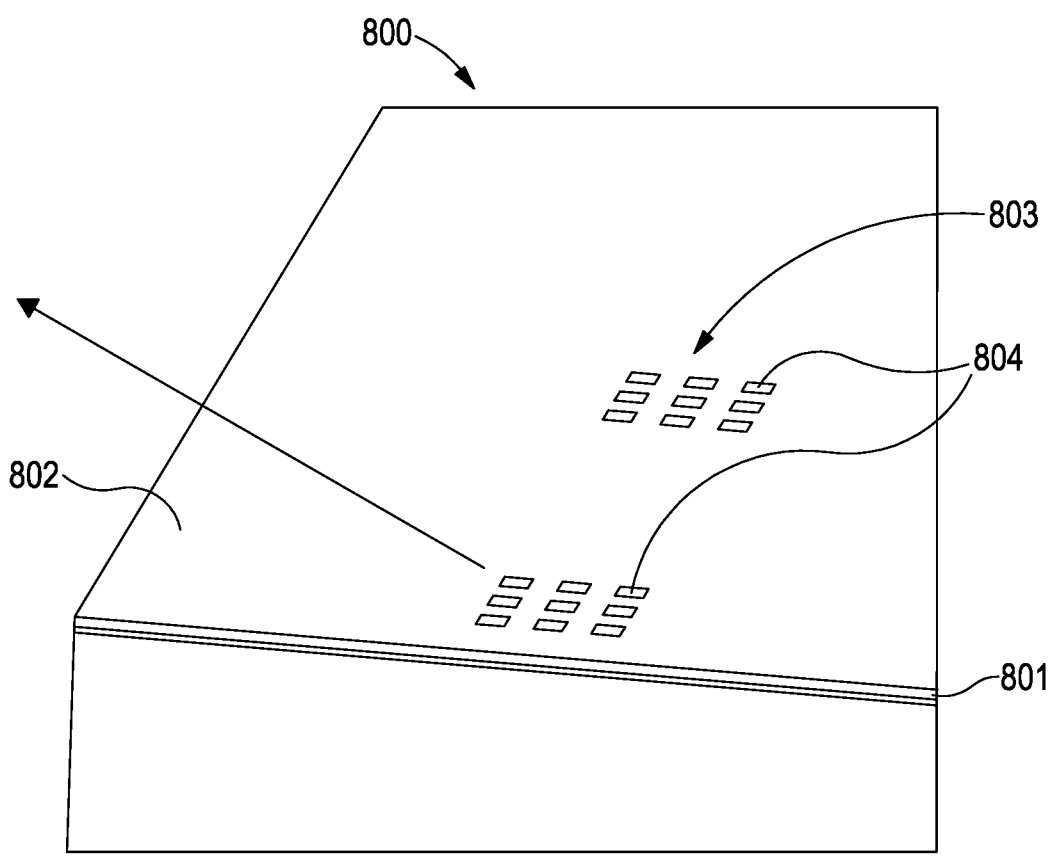
FIG. 8a depicts a first step in a method of forming a micromirror array.

As illustrated in FIG. 8a, the method comprises providing a first silicon wafer 800 for forming the piezoactuators and the sensing elements. The first wafer 800 may be referred to as the "actuator wafer". The actuator wafer may be a silicon on insulator (SOI) wafer with a 4 µm silicon film 801. Low voltage active devices such as the sensing elements can be formed in the wafer 800 using a Complementary Metal Oxide Semiconductor (CMOS) Front End of Line (FEOL)

process. A CMOS Back End of Line (BEOL) process can then be used to form metal interconnect layers for connecting the low voltage devices to other circuitry. Chemical Mechanical Polishing/Planarization (CMP) can then be used to form a smooth surface with a planar oxide layer 802. A Cu damascene process can be used for forming a Cu bonding matrix 803 with CU pads 804 for subsequent Cu-Ox hybrid bonding to another wafer.

Figure 8B:
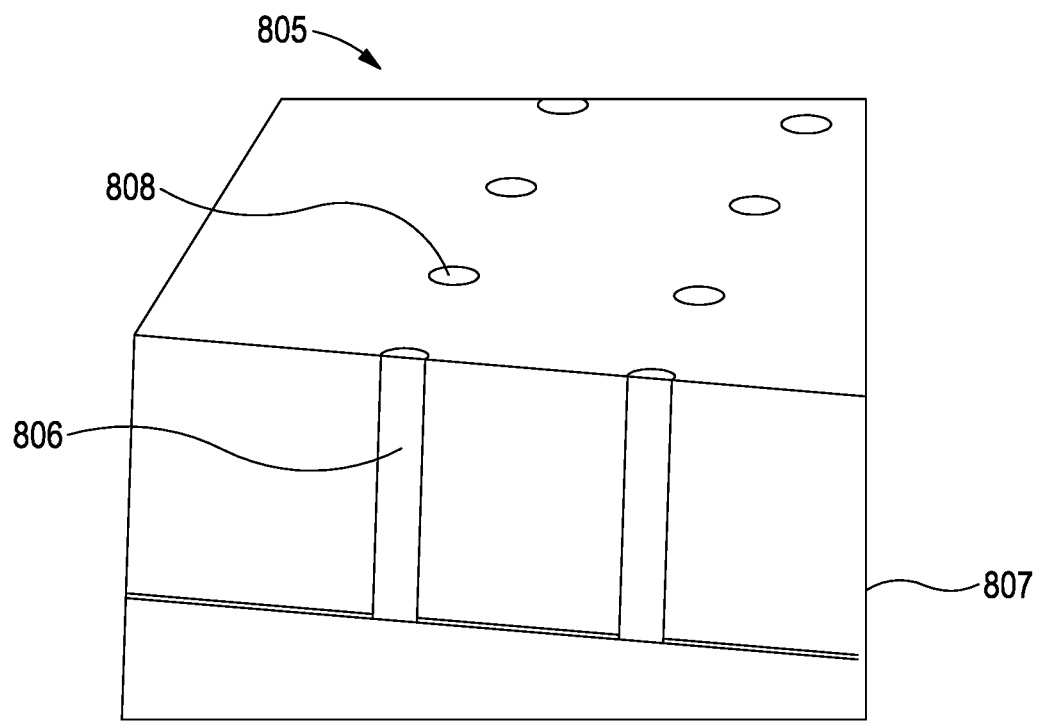
FIG. 8b depicts a second step in a method of forming a micromirror array.

As illustrated in FIG. 8b, the method further comprises providing a second silicon wafer 805 which will become the substrate on which the micromirror array is fixed. The second wafer 805 may be referred to as the "interposer wafer". The interposer wafer 805 may be an SOI wafer with a 100 μm silicon film as seen in FIG. 8b. A high voltage (HV) CMOS process (both FEOL and BEOL) may be used to form a HV driver in the wafer. A TSV process can be used to form electrical connections 806 through the silicon film 807 of the second wafer 805. The TSV process can be followed by planarization (e.g. CMP or wet etch) and Cu pad formation. The Cu pads 808 are arranged to connect to the Cu bonding matrix 803 of the first wafer 800.

Figure 8C:
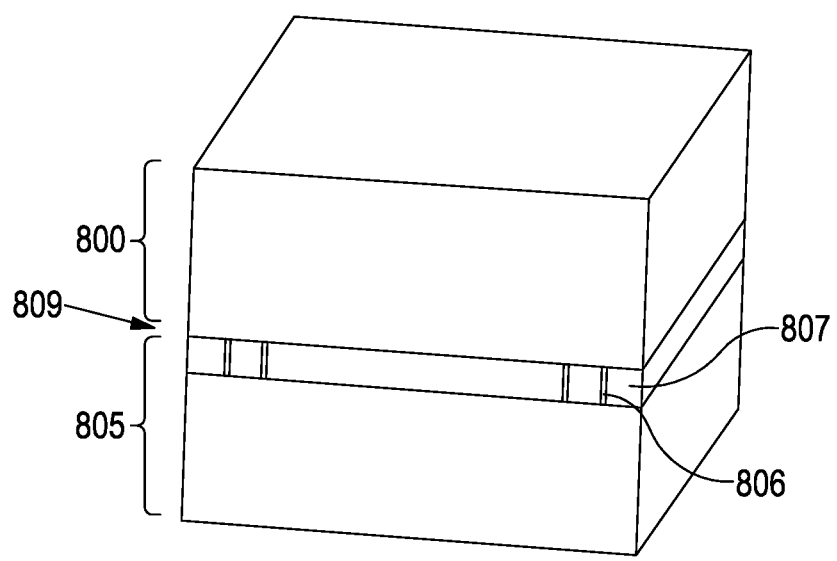
FIG. 8c depicts a third step in a method of forming a micromirror array.

FIG. 8c illustrates how the first and second wafers 800 and 805 are bonded, e.g. using a Cu/oxide hybrid bond 809.

Figure 8D:
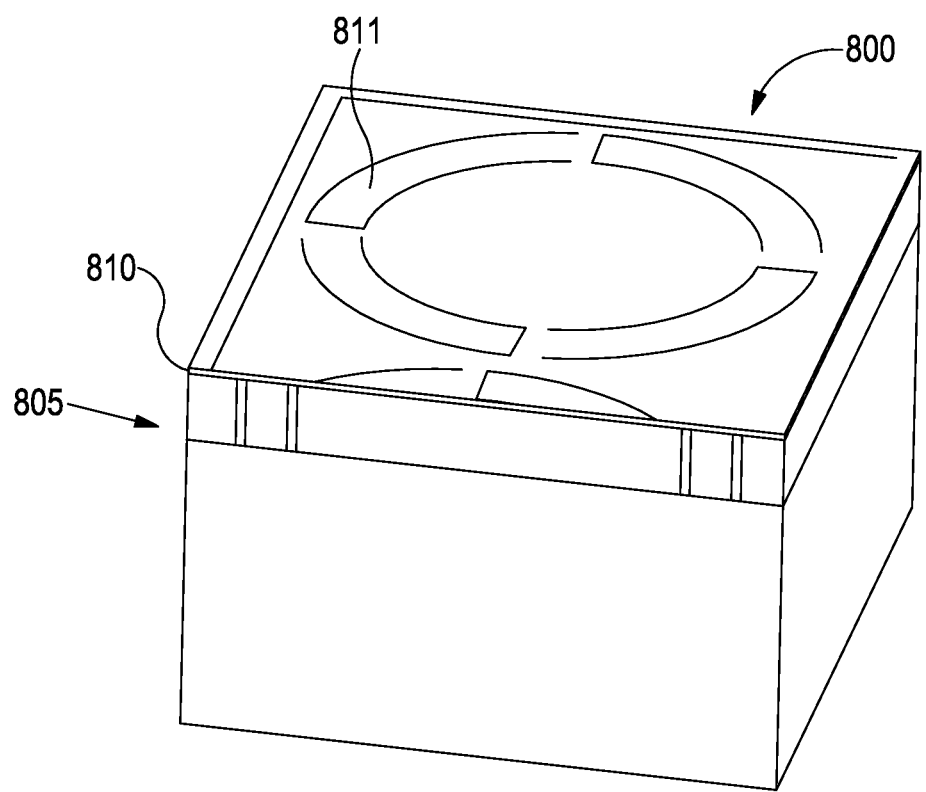
FIG. 8d depicts a fourth step in a method of forming a micromirror array.

As shown in FIG. 8d, the "handle wafer" used for handling the first wafer 800 may be removed to expose the first wafer 800. Selective box removal can then be used to leave a thin layer (e.g. 5 μm) of silicon 810 of the first wafer 800 bonded to the second wafer 805. Al can be deposited and patterned on the first wafer 800 for subsequent connection to a mirror. The first wafer 800 can be patterned to form the piezoelectric actuators 811. $Al_2O_3$ and/or TiN can be deposited on the first wafer for protection against EUV radiation and against plasma.

Figure 8E:
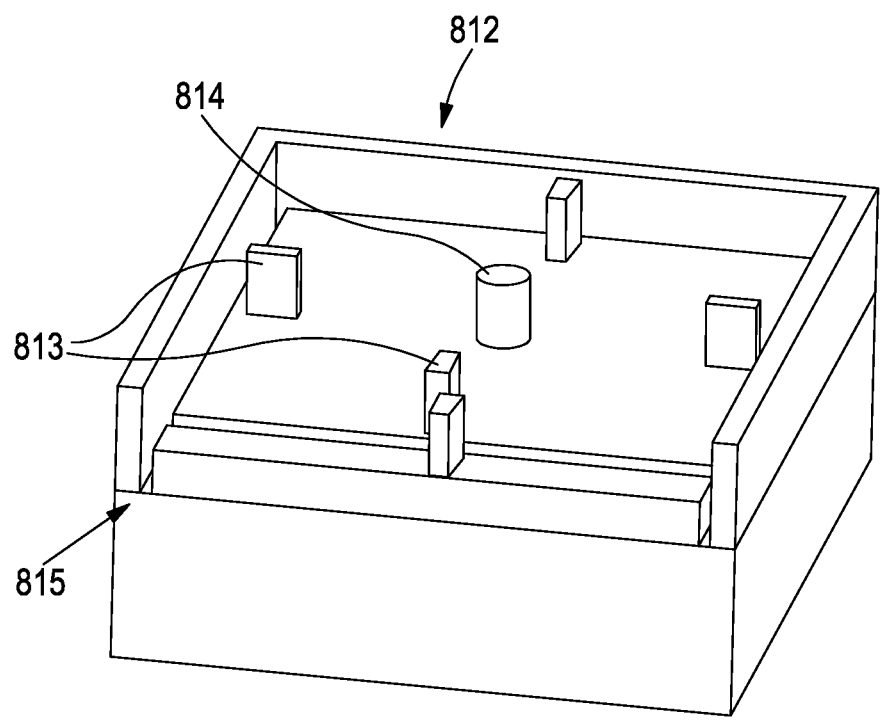
FIG. 8e depicts a fifth step in a method of forming a micromirror array.

As illustrated in FIG. 8e, the method further comprises providing a third silicon wafer 812 for forming the mirror. The third wafer 812 may be referred to as the "mirror wafer" 812. The mirror wafer 812 may be an SOI wafer with a 250 μm silicon film. The method may comprise performing a cavity etch on the mirror wafer 812 to allow for a thermal barrier (e.g. 1 μm to 2 μm), followed by Ge deposition for subsequent bonding to the first wafer 800. Using a hardmask (e.g. nitride) and a resist mask the mirror wafer 812 is etched to form pillars 813 ("beam connectors") for connecting to the piezoelectric actuators and to form a thermally conductive post 814 ("center post") for connecting to a heat sink so as to form a heat diffuser. A mirror release trench 815 is etched around the periphery of the mirror.

Figure 8F:
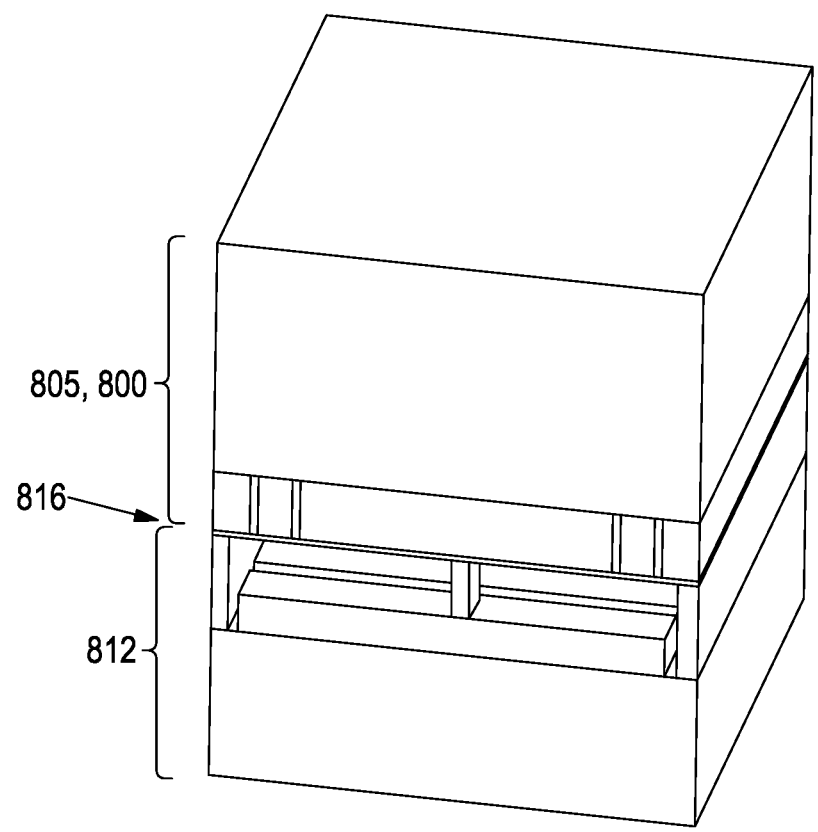
FIG. 8f depicts a sixth step in a method of forming a micromirror array.

As shown in FIG. 8f, the third wafer 812 is bonded to the first wafer 800 in order to connect the mirror to the piezoelectric actuators. The step of bonding may comprise aligned Ge/Al eutectic bonding. The Al/Ge bonding layer 816 is both thermally and electrically conducting, which can allow efficient heat transfer from the mirror through the thermally conductive post to the heat sink. Some of the box oxide may have been left on the first wafer 800 to reduce thermal and electrical conduction at some bonding locations such as at the pillars connected to the piezoelectric actuators.

Figure 8G:
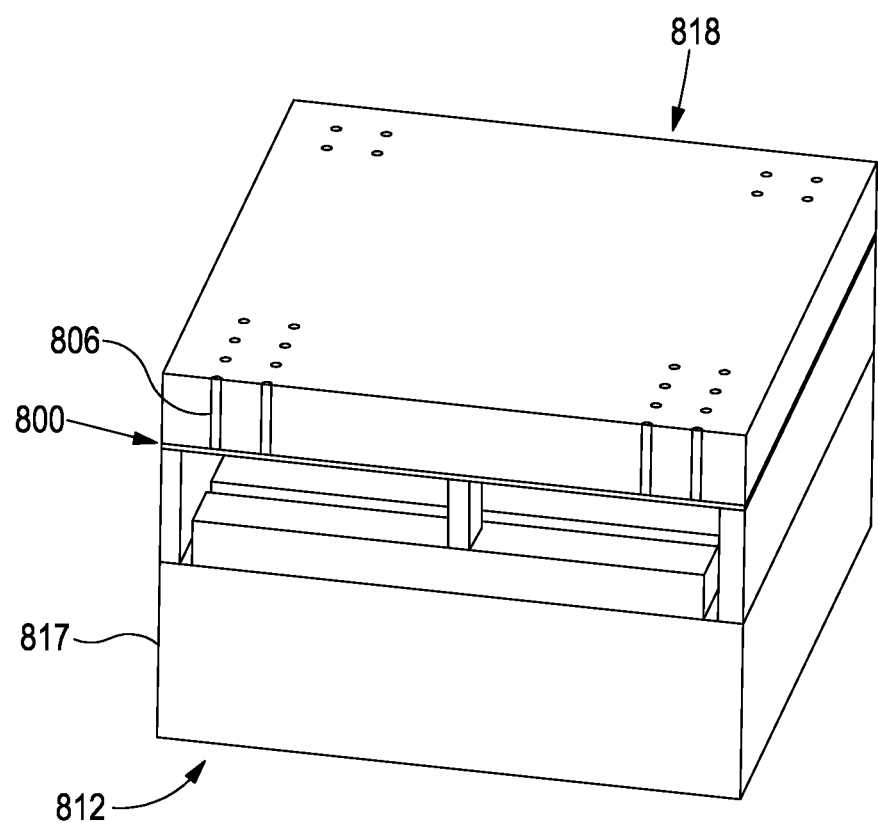
FIG. 8g depicts a seventh step in a method of forming a micromirror array.

In FIG. 8g, the stack of bonded wafers (wafers 1 "actuator wafer" 800, 2 "interposer wafer" 805 and 3 "mirror wafer" 812), which may collectively be referred to as the "device wafer", is turned upside down, so that the handle wafer 817 of the mirror wafer 812 becomes the supporting wafer. The handle wafer of the second wafer 805 can be removed from the second wafer 805 and box removal may be used to reveal the TSVs 806 in the second wafer 805. This can be followed by dielectric deposition, patterning and bump formation.

Figure 8H:
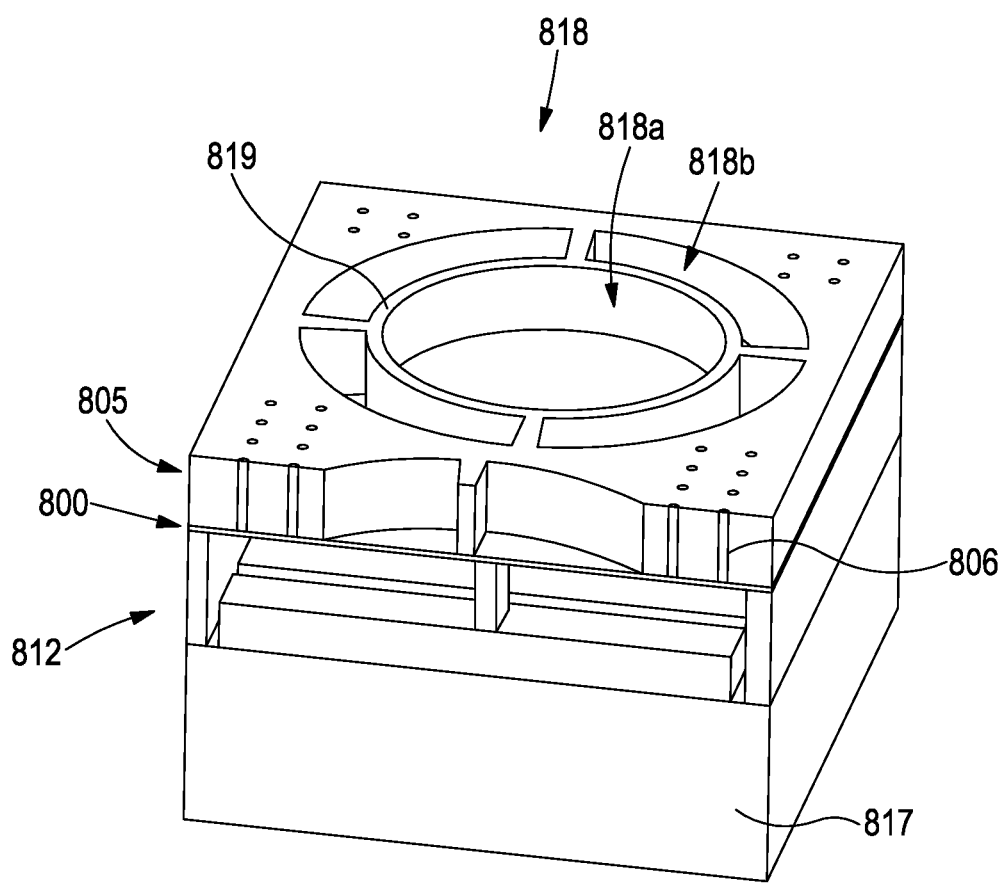
FIG. 8h depicts an eighth step in a method of forming a micromirror array.

In FIG. 8h, lithography and silicon etching is used to form cavities 818 in the second wafer 805 underneath the piezoelectric actuators and the heat sink. Note that in use an outer portion of the flexible membrane 314 (e.g. a portion radially outward of the grooves) is in contact with a wall 819. The wall 819 is between a cavity 818a in register with the heat sink and a cavity 818b in register with the piezoelectric actuators. The wall 819 is able conduct heat from the flexible membrane 314 to the substrate. The method then comprises etching a dielectric layer to reveal the piezoelectric actuators (i.e. to release the strip of flexible material), the sensing elements and dicing scribes.

Figure 8I:
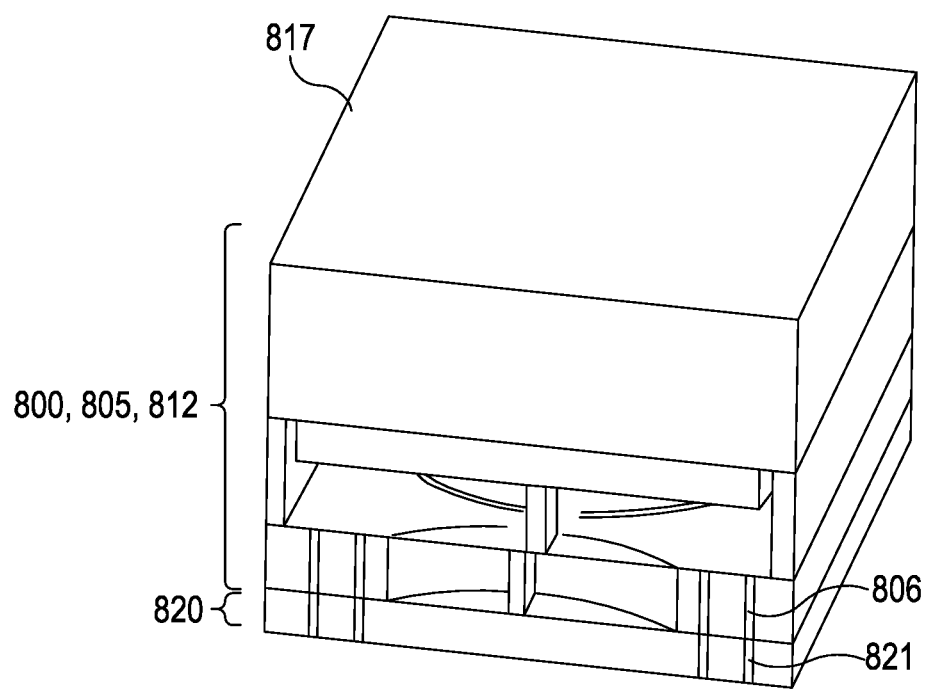
FIG. 8i depicts a ninth step in a method of forming a micromirror array.

As illustrated in FIG. 8i, the method further comprises providing a fourth silicon wafer 820 for sealing the second wafer 805. The fourth wafer 820 may be referred to as the "support wafer" 820 and comprises TSVs 821 for connecting to the second wafer 805. Bump bonding may be used to bond the fourth wafer 820 to the second wafer 805. An Al redistribution layer (RDL) and connection pads can be formed on the back of the fourth wafer 820.

Figure 8J:
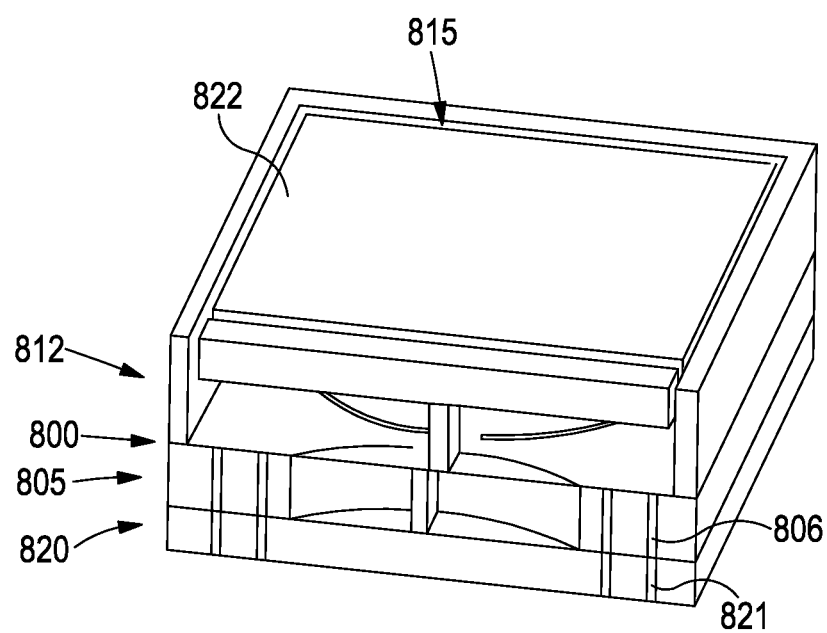
FIG. 8j depicts a tenth step in a method of forming a micromirror array.

In FIG. 8j, the mirror 822 is released by removing the front side handle wafer 817. A controller chip can be glued and wirebonded to the back of the fourth wafer 820.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A micromirror array comprising:
 a substrate;
 a plurality of mirrors configured to reflect incident light;
 for each mirror of the plurality of mirrors, at least one piezoelectric actuator connected to the substrate and configured to displace the mirror;
 one or more pillars connecting the mirror to the at least one piezoelectric actuator;
 for each mirror of the plurality of mirrors:
  a heat diffuser configured to diffuse heat from the mirror, wherein the heat diffuser comprises a heat sink, and
  a thermally conductive post configured to connect the heat sink to the mirror.
2. The micromirror array of claim 1, wherein the heat sink comprises a flexible membrane that allows the thermally conductive post to pivot in response to the mirror being displaced.
3. The micromirror array of claim 2, wherein the flexible membrane comprises a patterned silicon layer.
4. The micromirror array of claim 2, wherein the flexible membrane comprises grooves through the silicon layer and extending from an outer edge of the heat diffuser towards the thermally conductive post.
5. The micromirror array of claim 4, wherein the grooves are curved grooves.

6. The micromirror array of claim 1, wherein the thermally conductive post is electrically conductive and connected to ground.

7. The micromirror array of claim 1, wherein the at least one piezoelectric actuator comprises:
   a strip of flexible material connected at one end to the substrate, wherein one of the one or more pillars is located at an opposite end of the strip of flexible material; and
   a layer of piezoelectric material provided on the strip of flexible material.

8. The micromirror array of claim 7, wherein the at least one piezoelectric actuator further comprises:
   a hinge connected to an end of the strip of flexible material and to the pillar, and
   wherein the hinge has a smaller cross section than the strip of flexible material in the elongation direction of the strip.

9. The micromirror array of claim 1, wherein the one or more pillars comprise a thermally isolating layer configured to reduce or prevent heat transfer from the mirror to the at least one piezoelectric actuator.

10. The micromirror array of claim 1, wherein the one or more pillars are configured to electrically isolate the mirror from the at least one piezoelectric actuator.

11. The micromirror array of claim 1, comprising, for each mirror of the plurality of mirrors, at least one sensing element connected to the at least one piezoelectric actuator and configured to sense displacement of the mirror.

12. The micromirror array of claim 11, wherein the sensing element comprises a piezoresistor configured so that displacement of the mirror causes the piezoresistor to deflect.

13. The micromirror array of claim 12, wherein the sensing element further comprises a temperature sensor to measure the temperature of the piezoresistor.

14. The micromirror array of claim 1, wherein each mirror of the plurality of mirrors is configured to reflect light having a wavelength of substantially 13.5 nm.

15. The micromirror array of claim 1, wherein the at least one piezoelectric actuator comprises four piezoelectric actuators configured so as to enable tip and tilt displacement control of the mirror.

16. A programmable illuminator comprising:
   a micromirror array comprising:
      a substrate;
      a plurality of mirrors configured to reflect incident light;
      for each mirror of the plurality of mirrors, at least one piezoelectric actuator connected to the substrate and configured to displace the mirror;
      one or more pillars connecting the mirror to the at least one piezoelectric actuator;
      for each mirror of the plurality of mirrors:
         a heat diffuser configured to diffuse heat from the mirror, wherein the heat diffuser comprises a heat sink, and
         a thermally conductive post configured to connect the heat sink to the mirror wherein the micromirror array is configured to condition a radiation beam.

17. The programmable illuminator of claim 16, comprising:
   a displacement control feedback system configured to determine, for each mirror of the plurality of mirrors, a position of the mirror and to adjust a voltage applied to the one or more piezoelectric actuators based on the determined position and based on a predefined target position of the mirror.

18. A lithographic apparatus configured to project a pattern from a patterning device onto a substrate, comprising:
   a programmable illuminator of claim 16 configured to condition a radiation beam used to:
      illuminate the patterning device; or
      measure a target structure on the substrate.

19. An inspection apparatus comprising:
   a programmable illuminator of claim 16 configured to condition a radiation beam used to measure a target structure on a substrate.

20. A method comprising:
   coupling at least one piezoelectric actuator to a substrate and each of a plurality of mirrors to allow for displacing each mirror in the plurality of mirrors with respect to the substrate;
   coupling one or more pillars to each mirror in the plurality of mirrors and to the at least one piezoelectric actuator; and
   coupling a heat diffuser for diffusing heat from each mirror in the plurality of mirrors through a heat sink and a thermally conductive post connected to each mirror.

21. The method of claim 20, wherein the heat sink comprises a flexible membrane that allows the thermally conductive post to pivot when the mirror is displaced.

22. The method of claim 21, further comprising patterning a silicon layer on the flexible membrane.

23. The method of claim 21, further comprising forming grooves on the flexible membrane that extend from an outer edge of the heat diffuser towards the thermally conductive post.

24. The method of claim 23, wherein the grooves are curved grooves.

25. The method of claim 20, wherein forming the piezoelectric actuator comprises:
   forming a curved strip comprising a layer of silicon and a layer of piezoelectric material; and
   forming a hinge connected to an end of the curved strip and to the pillar, wherein the hinge is thinner than the strip.

26. The method of claim 20, wherein the one or more pillars comprises a thermally isolating layer in the or each pillar to reduce or prevent heat transfer from the mirror to the at least one piezoelectric actuator.

27. The method of claim 20, further comprising:
   coupling at least one sensing element to each mirror of the plurality of mirrors for sensing displacement of the mirror.

28. The method of claim 27, wherein the at least one sensing element comprises a piezoresistor configured so that displacement of the mirror causes the piezoresistor to deflect.

29. The method of claim 28, wherein the at least one sensing element comprises a temperature sensor for measuring temperature of the piezoresistor.

30. The method of claim 20, wherein the at least one piezoelectric actuator comprises four piezoelectric actuators configured so as to enable tip and tilt displacement control of the mirror.

* * * * *

UNITED STATES PATENT AND TRADEMARK OFFICE
CERTIFICATE OF CORRECTION

PATENT NO. : 12,276,784 B2
APPLICATION NO. : 17/635907
DATED : April 15, 2025
INVENTOR(S) : Haspeslagh et al.

It is certified that error appears in the above-identified patent and that said Letters Patent is hereby corrected as shown below:

On the Title Page

Column 1, Item (73), in "Assignees", Line 2, delete "v.Z.W.," and replace with --v.z.w.,--.

Column 2, Item (57), under "Abstract", Line 2, delete "minors" and replace with --mirrors--;

Column 2, Item (57), under "Abstract", Line 3, delete "minors," and replace with --mirrors,--;

Column 2, Item (57), under "Abstract", Line 4, delete "minor," and replace with --mirror,--;

Column 2, Item (57), under "Abstract", Line 7, delete "minor" and replace with --mirror--.

In the Specification

In Column 8, Line 50, delete "1135" and replace with --113S--.

Signed and Sealed this
Twenty-seventh Day of May, 2025

Coke Morgan Stewart
*Acting Director of the United States Patent and Trademark Office*